(12) United States Patent
Cobussen et al.

(10) Patent No.: US 9,798,228 B2
(45) Date of Patent: Oct. 24, 2017

(54) MAXIMIZING POTENTIAL GOOD DIE PER WAFER, PGDW

(71) Applicant: NXP B.V., Eindhoven (NL)

(72) Inventors: Hans Cobussen, Nijmegen (NL); Tonny Kamphuis, Nijmegen (NL); Heimo Scheucher, Gratkorn (AT); Laurentius de Kok, Nijmegen (NL)

(73) Assignee: NXP B.V., Austin, TX (US)

( * ) Notice: Subject to any disclaimer, the term of this patent is extended or adjusted under 35 U.S.C. 154(b) by 0 days.

(21) Appl. No.: 14/869,416

(22) Filed: Sep. 29, 2015

(65) Prior Publication Data

US 2017/0092636 A1    Mar. 30, 2017

(51) Int. Cl.
*G03F 1/44* (2012.01)

(52) U.S. Cl.
CPC .................................... *G03F 1/44* (2013.01)

(58) Field of Classification Search
None
See application file for complete search history.

(56) References Cited

U.S. PATENT DOCUMENTS

| | | | |
|---|---|---|---|
| 6,680,523 B2 | 1/2004 | Schober et al. | |
| 7,538,444 B2 | 5/2009 | Scheducher et al. | |
| 2008/0073753 A1* | 3/2008 | Tsai | H01L 22/34 257/620 |
| 2008/0277659 A1* | 11/2008 | Hsu | H01L 22/34 257/48 |
| 2009/0121321 A1* | 5/2009 | Miccoli | G03F 7/70625 257/618 |
| 2009/0197394 A1* | 8/2009 | Parekh | H01L 21/78 438/462 |
| 2009/0309097 A1* | 12/2009 | Hsieh | H01L 22/34 257/48 |
| 2010/0140748 A1* | 6/2010 | Scheucher | H01L 22/34 257/620 |
| 2010/0181568 A1* | 7/2010 | Scheucher | G03F 7/70433 257/48 |

(Continued)

OTHER PUBLICATIONS

"Dicing Before Grinding (DBG) Process", Disco Corporation, 1 pg., retrieved from the Internet at: http://www.disco.co.jp/eg/solution/library/dbg.html (Sep. 29, 2015).

(Continued)

*Primary Examiner* — Evren Seven

(57) ABSTRACT

Consistent with an example embodiment, there is a semiconductor wafer substrate comprising a plurality of integrated circuits formed in arrays of rows and columns on the wafer substrate. A plurality of integrated circuits are in arrays of rows and columns on the wafer substrate; the rows and the columns have a first width. First and second saw lanes separate the integrated circuits, the first saw lanes are arranged parallel and equidistant with one another in a first direction defined by rows, and the second saw lanes are arranged parallel and equidistant with one another in a second direction defined by the columns. A plurality of process modules (PM) are on the wafer substrate, the PM modules defined in an at least one additional row/column having a second width. The at least one additional row/column is parallel to the plurality of device die in one direction.

14 Claims, 5 Drawing Sheets

(56) References Cited

U.S. PATENT DOCUMENTS

| | | | |
|---|---|---|---|
| 2015/0102831 A1* | 4/2015 | Lee | G01R 31/2621 324/754.03 |
| 2015/0253380 A1* | 9/2015 | Schiessl | G01R 31/3183 702/117 |
| 2016/0027705 A1* | 1/2016 | Uehling | H01L 22/12 324/750.03 |
| 2016/0133531 A1* | 5/2016 | Yi | H01L 22/34 257/48 |

OTHER PUBLICATIONS

"Deep reactive-ion etching", Bosch Corporation, 1 pgs, retrieved from the Internet at: https://en.wikipedia.org/wiki/Deep_reactive-ion_etching (Sep. 29, 2015).

* cited by examiner

MAXIMIZING POTENTIAL GOOD DIE PER WAFER, PGDW

FIELD

The embodiments of the present disclosure relate to semiconductor manufacturing. In particular the disclosure relates to increasing the number of useable device die on a wafer substrate.

BACKGROUND

The electronics industry continues to rely upon advances in semiconductor technology to realize higher-function devices in more compact areas. During wafer processing it is necessary to monitor the various process parameters

SUMMARY

In semiconductors, Potential Good Die per Wafer, PGDW is an indicator for the capacity of a wafer substrate which in turn can be an indicator of a given throughput of the wafer fab processing these substrates. Currently the die sizes of products are decreasing and an increasing amount of area is wasted on scribe and saw lanes. The scribe and saw lanes area are also used for placing optical characterization modules (OCM) and process control modules (PCM), etc. These process (PM) modules create challenges in high yield die singulation processes. There is a need for processing a wafer substrate with PGDW that may be maximized to reduce product loss and reduce costs while increasing the throughput of the wafer production line.

According to embodiments of the present disclosure, one may combine the PCM/OCM in columns on either side of the reticle, isolate them to specific area and leave more space for potential good die (PGD) by allowing for reduced-width saw/scribe lanes between the PGD. The typical downsides of probing on PM include damaging needles, losing yield due to having to cut through PM at die-singulation. These downsides are eliminated by the using the two column concept of positioning PM (with the re-designed reticle) on one or two vertical (or horizontal) sides of the reticle. Thus, the present disclosure enables reduced the area waste in saw lanes between product devices and concentrates the PM in horizontal or vertical columns over the wafer. Currently the minimum dimension of test pads on the PM define the minimum width of the saw lane, which is partly solved by applying drop in PM, however such a layout results in touchdown of wafer probes onto PM during testing. The new lay out, addresses these challenges. Further non-mechanical die separation methods are feasible, such as but not limited to plasma dicing, resulting in enhanced die strength and overall reduced product costs.

In an example embodiment, there is a semiconductor wafer substrate. The wafer substrate comprises a plurality of integrated circuits (ICs) formed in arrays of rows and columns on the wafer substrate, the rows and the columns having a first width. First and second saw lanes separate the integrated circuits, the first saw lanes being arranged parallel and equidistant with one another in a first direction defined by rows, and the second saw lanes being arranged parallel and equidistant with one another in a second direction defined by the columns. A plurality of process modules (PM) are formed on the wafer substrate, the PM modules formed in an at least one additional row/column having a second width, the at least one additional row/column parallel to the plurality of device die in one direction.

In another example embodiment, there is a method for fabricating a reticle having at least two exposure fields. The method comprises, placing an integrated circuit (IC) device pattern within a first exposure field, the IC device pattern consisting of a plurality of device die arranged in an row/column array, the plurality of device die separated by saw lane boundaries of a first width, in row-direction and a column-direction, placing a process monitor (PM) pattern within a second exposure field, the second exposure field adjacent and parallel to the row/column array in one direction, the PM pattern having a saw lane boundary of a second width wider than the first width, the PM pattern having a plurality of individual test devices, and arranging the PM patterns such that the plurality of the individual test devices substantially do not intersect the saw lane boundaries of the plurality of device die.

The above summaries are not intended to represent each disclosed embodiment, or every aspect, of the present disclosure. Other aspects and example embodiments are provided in the figures and the detailed description that follow.

BRIEF DESCRIPTION OF THE DRAWINGS

The invention may be more completely understood in consideration of the following detailed description of various embodiments of the invention in connection with the accompanying drawings, in which.

Figure 1:
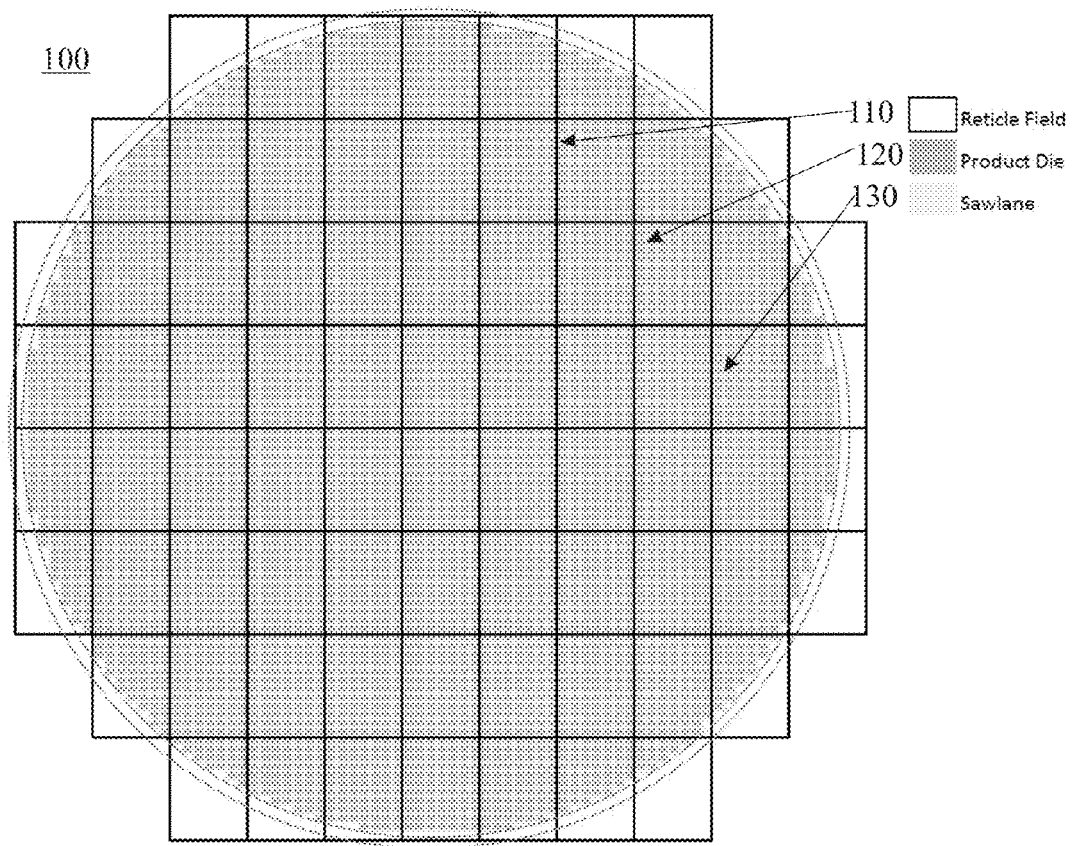
FIG. 1 is an example of a reticle field and its relationship to device die defined on a wafer substrate.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present disclosure has been found useful in increasing the potential good die per wafer (PGDW). The reduced pitch of rows and columns (i.e., smaller saw lane widths) between product device die results in significantly more device die to be printed on a given wafer substrate. The placement of process monitor (PM) devices are placed in a different, which either be larger or smaller, pitch row or column adjacent to product device die. PM devices may include, but not be limited to, process control monitor (PCM) devices and optical control monitor (OCM) devices, T-boxes, Vernier targets, etc. The PM devices no longer displace device die on the wafer or interfere with the processing and testing of the device die. Further, in that the PM devices run along the entire wafer surface, but do not determine the size of spacing between device die anymore. As such they enable relative product area gain from the reduced saw lane widths attributable to advanced die separation technologies. PM verification of process consistency may include, but not necessarily be limited to, device parametric measurements (e.g., threshold voltages, leakage currents, etc.), optical parameters (e.g., accuracy of focus, printing of features, alignment, etc.).

Refer to FIG. 1. A wafer substrate 100, has a reticle field (RF) containing product device die 110 and PM devices (not illustrated) defined thereon. Each of the reticle fields contain product device die 110 are bounded by saw lanes 130 in an X-direction and Y-direction. The reticle field 110 define an array of product device die 110 and PM which would be printed onto the wafer substrate 100 by a stepper or scanner apparatus during each photo-lithographic step in a modern wafer fabrication process. The reticle field is repeatedly exposed in steps, as the stepper apparatus indexes across the wafer, during the lithography (mask) steps or the scanner apparatus scans during wafer fabrication. For the purposes of discussion, the term "stepper" is meant to include any apparatus that enables the features of a reticle or equivalent tooling, to render features onto a semiconductor substrate through photo-lithographic techniques or equivalent.

In this example, the reticle field has a 12 row×7 column array of product device die 110. The number device in the reticle field may be more or fewer depending upon device die size. The die pitch in the row (X) and column (Y) direction is equal across the wafer. Product testing on the wafer can be done per product ("single site") or on more products in one probe touch down ("multi-site-probing")

After electrically testing of the modules and the products, a dicing process separates the wafer into dies for assembly.

The designed minimum saw lane 130 width is limited by the required minimum area for electrical contact (probing technology) with devices.

Figure 2:
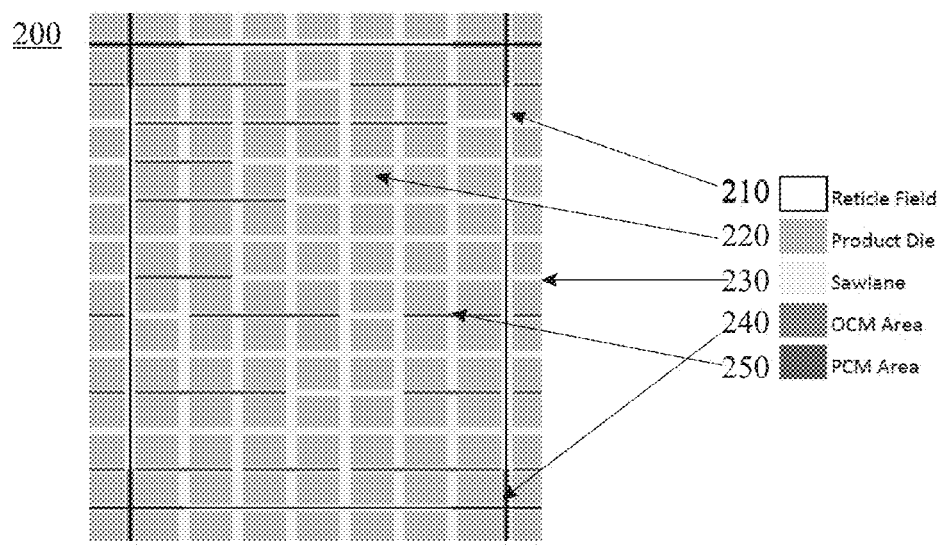
FIG. 2 is an example of a reticle field layout having saw lane process monitor (PM) devices.

Refer to FIG. 2. A Reticle Field layout mainly consists of a product device die array; a limited number of products in rows and columns, separated by saw lanes. In an example print of a reticle field 210, from a wafer substrate portion 200. Device product die (in a 7×12 array) 220 are bounded by saw lanes 230. Process monitor (PM) devices 240/250 are placed in saw lanes between devices. In advanced process technologies, the optical characterization modules 240 and electrical process monitor modules 250 are designed to be placed in the saw lanes (spacing between die sides), to efficiently use this waste area.

During wafer processing it is necessary to optically measure the mask steps quality, by an Optical Control Monitor (OCM) devices 240. Such parameters may include, but not so necessarily limited, X and Y alignment between layers, the degree of focus across a wafer substrate, rotational error, etc.

As a wafer acceptance test end of line, the device die are electrically measured on device process parameters particular to a given product functionality. Test Keys or Process Control Monitor (PCM) structures 250 are used to monitor and characterize the transistors and other components which are fabricated. For transistors these parameters would include layer thicknesses and threshold voltages, source-drain resistance, via chain resistance, oxide breakdown voltage, transistor breakdown voltages, etc.

Figure 3:
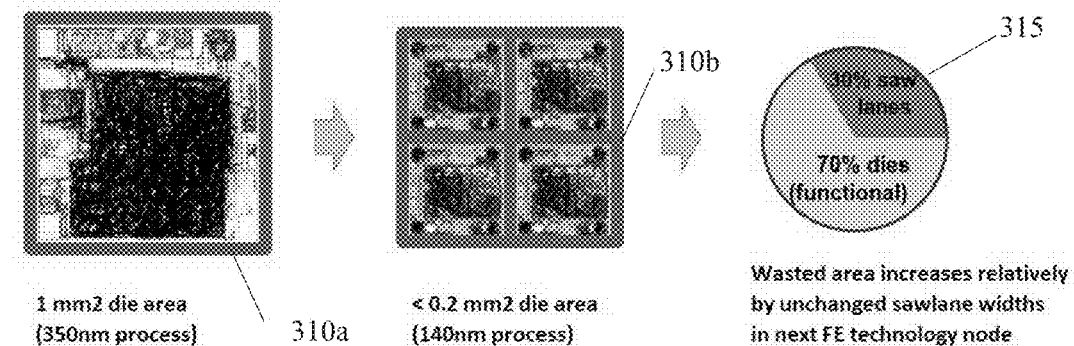
FIG. 3 is an example of a semiconductor device with a given functionality and size and that same functionality has evolved onto a smaller device size, the layout having a relatively higher area consumed by saw lanes.

Refer to FIG. 3. In an example embodiment, a product device 310a in an example "C075" technology, is about 350 nm line width with an area of about 1 mm². With front end (FE) technology allowing for smaller linewidths, in an example "C14" process, the same product device 310b has a 140 nm linewidth with an area less than about 0.2 mm². The product shrink results in 5 times as many product devices on a given size wafer substrate. If the width of the saw lanes is unchanged, relative wafer area consumed by saw lanes (waste) is significantly increased. For this example 315, only 70% of the wafer is used for device product, 30% of the wafer area is consumed by saw lanes, thus 30% of the wafer ends of discarded. Further, die singulation is more difficult for small devices compared to that for large device die. The interference of PM structures, which may be present in the saw lanes, may give rise to product quality and reliability issues.

Figure 4:
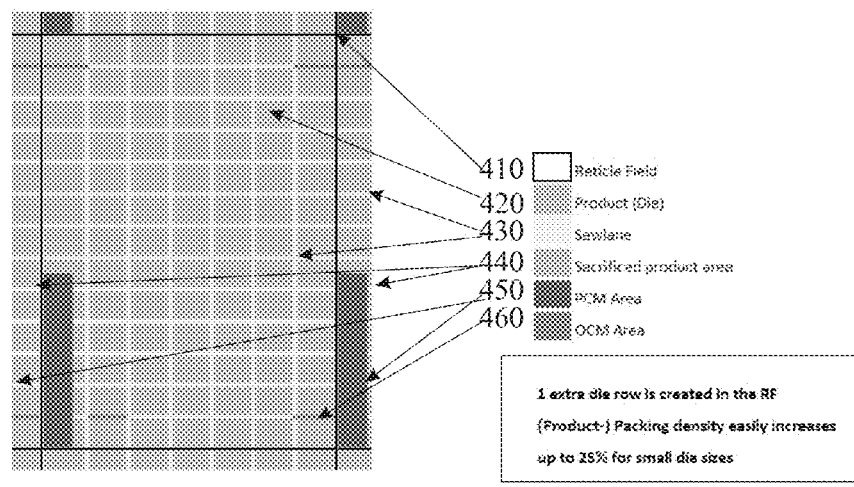
FIG. 4 is an example a an arrangement of product devices and drop-in PM devices.

Refer to FIG. 4. A Drop-in PM layout is especially efficient for small die sizes, where the PMs are placed in a number of sacrificed products area, per reticle field. The structures are arranged so that the PMs are not in the saw lanes. The die pitch is maintained across the whole wafer. Multi-site probe cards touch-down on the drop-in PCM areas during probing. The probing of PM devices may result in early wear-out of multi-site probe needles, repairs, re-probe actions during wafer test or test-yield loss, etc.

On a wafer substrate 400, reticle field 410 defines the area in which product die 420 are printed; in this particular example embodiment, there are extra rows 420 of product die. The device die are bounded by saw lanes 430. Sacrificial areas 440 (in which product die 420, are displaced) are taken by PCM devices450. Optical test patterns 460 may be placed these in these sacrificial areas 440 or be designed to be placed defined locations in the saw lanes 460.

Figure 5:
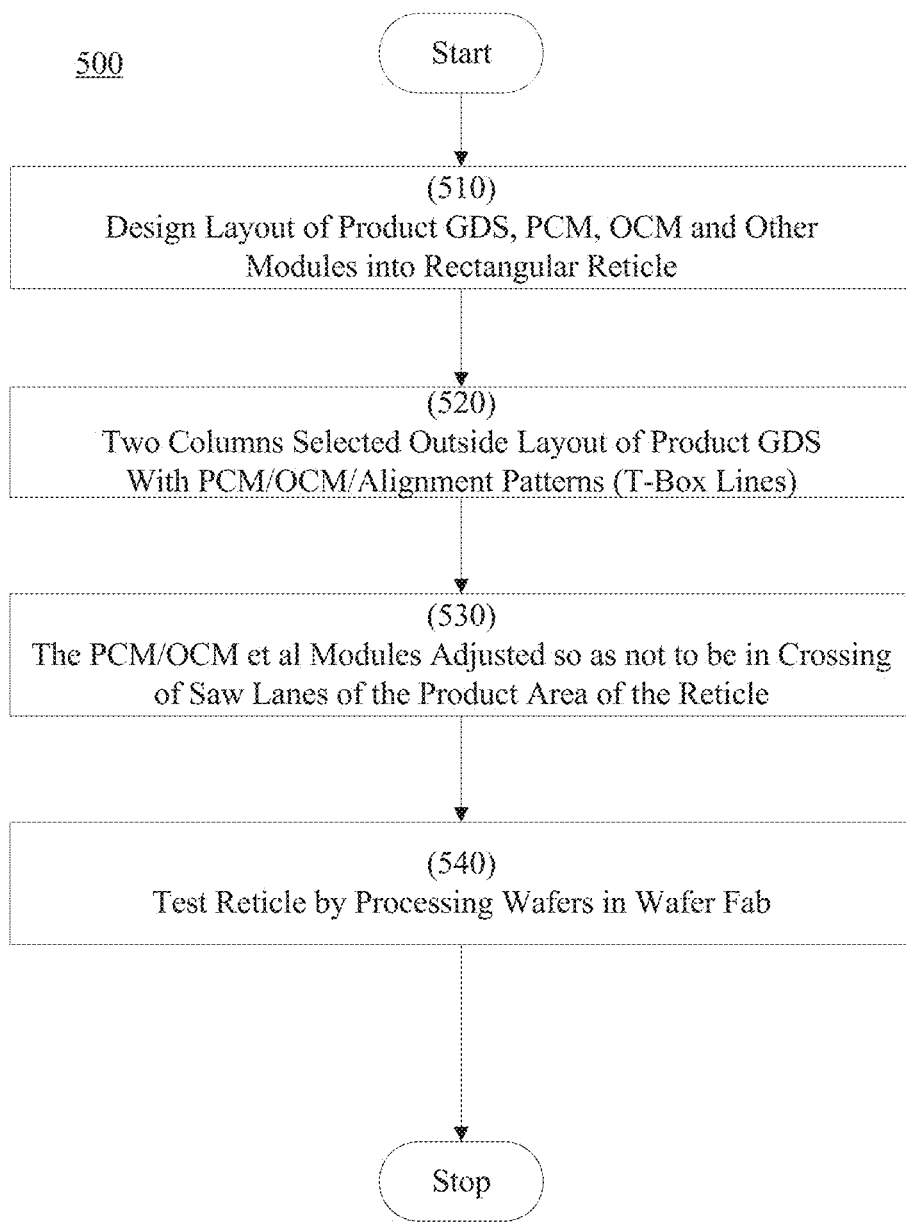
FIG. 5 is a flow diagram of the configuring of a reticle in accordance with an embodiment of the present disclosure.

Refer to FIG. 5. In an example process flow 500, a reticle is designed according to embodiments of the present disclosure. The reticle (of precision optical glass) is loaded into a stepper apparatus and through photolithography, renders the product device die features, process control monitors (PCM), optical characterization monitors (OCM), and other modules onto a semiconductor substrate. These substrates may be silicon, gallium-arsenide (GaAs), silicon-on-insulator (SOI), etc. but are not necessarily so limited. In step 510, the user designs the product device and or the PCM, OCM, or other test modules. Through electronic design automation (EDA) tools, schematic capture, simulation, layout and other automated design tools, etc., a layout of these circuits is generated. For example, a GDS or GDSII (graphic database system) file is layout design file of the integrated circuit (IC). From this GDS file, the physical layout of the device is rendered onto rectangular reticle (i.e., photomask). The reticle may have one or more layers of the IC device along with its corresponding test modules. The process from "design-to-reticle-to-wafer" takes into account the particular wafer fabrication process to be used. In step 520, two columns are selected outside of the product device's layout boundaries. These two columns are used to accommodate the PCM, OCM, alignment patterns (T-box lines, for example a PCM monitoring layer thickness). The saw lanes defined by the product device layout may be defined to be a different width than those in which test modules are placed. In one example, the saw lanes between device die may be narrower than the saw lanes containing the test modules. As discussed in reference to FIG. 3 the narrowing of the saw lanes between device die, owing to their reduction in size, reduces the amount of substrate material thrown away as discarded saw lanes. In step 520, the boundaries of the PCM/OCM et al modules are adjusted so as not to cross over the saw lanes (which define the product die area of the reticle). Any metallization or other material makes the use of economical mechanical sawing problematic. The metallization may induce stress in the substrate and cause cracking at device die edges. Though a plasma dicing may be used to cut through the metallization, it is not a cost-effective approach. The step/pitch between device die can be different than the step/pitch over a column of PM. Thus, in an example embodiment according to the present disclosure, two different pitches may be used in one or two directions in contrast to the constant pitch between device die on a wafer not having the described PM structures.

After the reticle has been made, in step 540, actual wafers are processed in a wafer fab configured with the process recipe compatible with the design-to-reticle-to-wafer flow. A given step, as part of a series of steps, in the making of the silicon are not designed or performed in isolation without knowledge of the effects of those steps preceding/following.

Figures 6A, 6B:
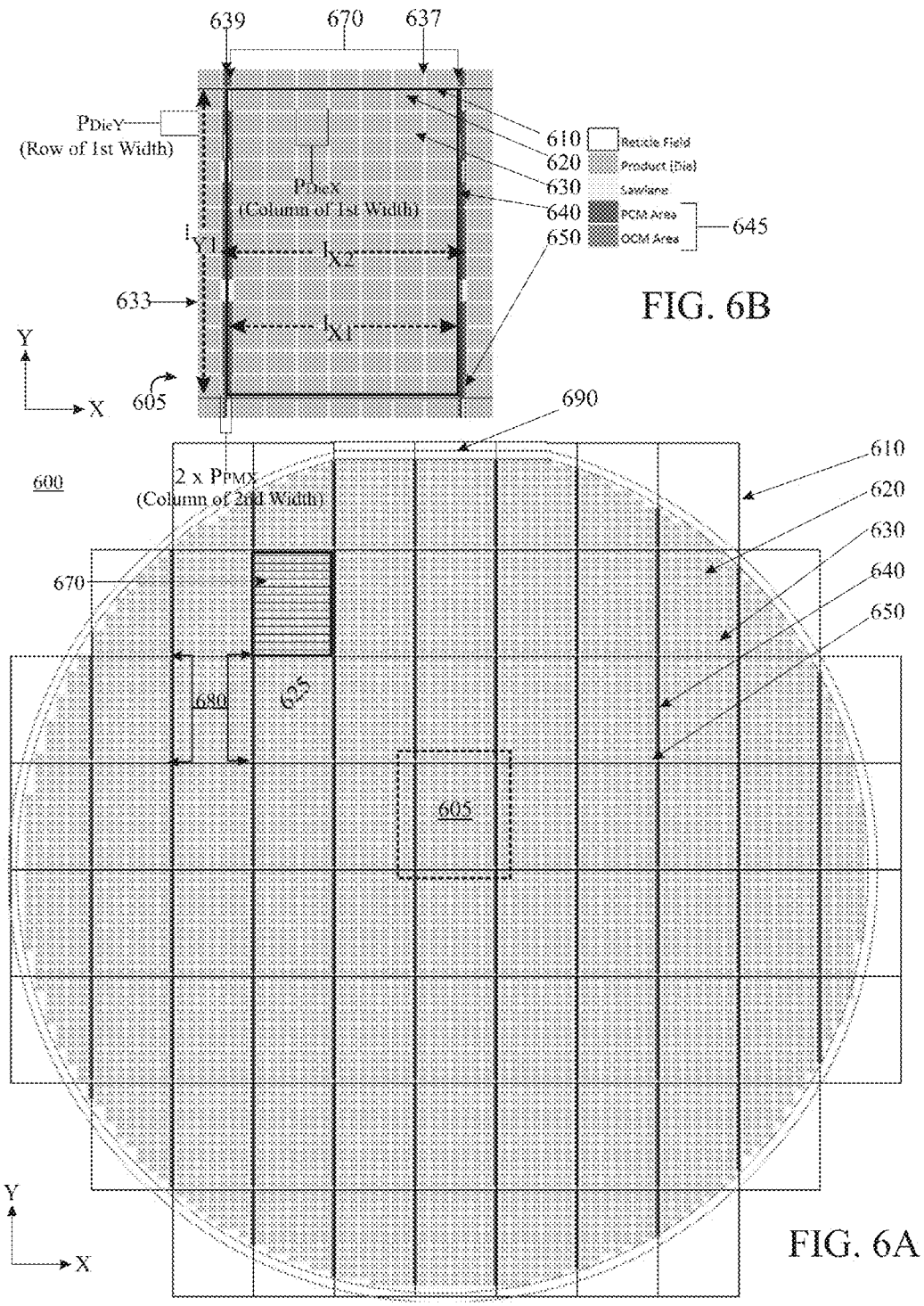
FIGS. 6A-6B is an arrangement of a reticle and its relationship to the defining of product devices and PM devices on a wafer substrate according to an embodiment of the present disclosure, PM devices laid out in a column (Y) direction.

Refer to FIGS. 6A-6B. In an example embodiment, a reticle field 610 has a plurality 625 of integrated circuits (IC) 620. Saw lanes 630 in an X-direction and a Y-direction separate the integrated circuits 620. Parallel and adjacent to the plurality 625 of integrated circuits 620 are PM structures 645 (of PCM 640/OCM 650). When reticle plate having the defined reticle field 610, is loaded onto a stepper apparatus during the IC manufacturing (so as to print the features of the devices of the IC), the reticle may be thought of as having two exposure fields. A first exposure field 670 of a plurality 670 of IC devices 620 and a second exposure field 680 of PM structures 645. In this example, the plurality 625 of the integrated circuits is in a 7×13 array. The number of devices in the reticle field 610 would be governed by the die size. For a given reticle, there would be more devices in the first exposure field 670 for die having a small area (i.e., a 1 mm×1 mm device) versus a much larger device (i.e., 10 mm×10 mm). Combining the PM in two columns and consequently reducing the saw lane width for device die singulation frees up space for one or more additional device die columns.

Refer to FIG. 6A. On an example wafer substrate 600, the plurality 625 IC devices and accompanying PM devices 645 have been printed on. Each print area 670 includes the 7×13 array of integrated circuits 620 and the PM devices 645 parallel to the IC devices 620. The PM devices in the manufacturing process seeks to print as many whole portions of the reticle, as possible on the wafer substrate 600. In this example, there are 76 IC/PM patterns (of the first exposure field 670 and second exposure field 680) printed onto the wafer. The appropriate number of reticle patterns is defined during the "tape out" process. Those areas near the edge of the wafer will have partial prints of the IC/PM patterns. Modern process techniques seek to maximize the number of functioning device die that may be printed onto a given wafer substrate.

The horizontal rows 633 parallel to the wafer flat 690 (of the example substrate) are of a first width. Note that the wafer flat serves as a reference point on the wafer substrate so that modern automated equipment may locate a starting point on the wafer in which begin a process. Some substrates, especially those of larger sizes, have a notch machined in them, to provide a starting reference. The first vertical columns perpendicular to the wafer flat 690 have a first width 637 for the device die and a second wider or smaller width 639 that accommodates the PM devices 645. The PM devices 645 occupy an additional vertical column 637 of the second width. The PM column on one side (i.e, a "left side") may not necessarily have the same width as the PM column on an opposite side (i.e., a "right side"). After printing the reticle field pattern 610 on the wafer substrate 600, the two PM columns form one entity. The additional vertical column of PM devices 645 is bounded by saw lanes 630 of the first width. Thus, only one saw lane width of a prescribed size is required. For example, if a saw lane width is 30 μm, between each device die, the saw lanes bounding the PM devices are each, also 30 μm. This vertical column 637 of PM devices forms a geometric chord on the circular wafer substrate 600; there will be one or more of these geometric chords for a given wafer substrate. In addition, between intersecting saw lanes of the device die, the PM patterns would likely be modified to not have metallization at these intersections so as to facilitate sawing and die separation.

Having printed the IC devices and PM on the wafer substrate 600. To perform wafer probing, for smaller die sizes, it is possible to design a probe card having multiple device die positions so that multiple device die may be simultaneously tested (on a single contact touch). For example, a wafer probe card may have seven devices spanning the first exposure field 670 printed. Thus, a prober may index from the wafer flat 690 one device row down the reticle field column, test the next seven devices, index downward by the IC device die pitch. After completing a column, the prober would index seven devices across plus the pitch of two PM patterns. Avoiding probe touch down on the PM patterns saves significant wear and tear on the wafer probe card in contrast to those wafers with PM devices printed in IC areas. The saw lanes have been reduced to accommodate more devices and are of a particular width. The PM is in a column (bounded by two parallel saw lanes) of the same or larger width than those surrounding the IC devices. The probing apparatus can be configured to have multiple values of indexing. In an example probing setup, pattern recognition may be programmed so that the wafer is indexed to the chosen device die under test. The indexing follows the relationships, $$\text{Index}_{X1} = N \times \text{Pitch}_{DeviceDie} \quad (1)$$

$$\text{Index}_{X2} = N \times \text{Pitch}_{DeviceDie} + 2 \times \text{Pitch}_{PM}(\text{Crossing over PM Patterns in } X\text{-Direction}) \quad (2)$$

$$\text{Index}_{Y1} = N \times \text{Pitch}_{DeviceDie}(\text{No crossing over PM Patterns in } Y\text{-Direction}) \quad (3)$$

Figure 7B:
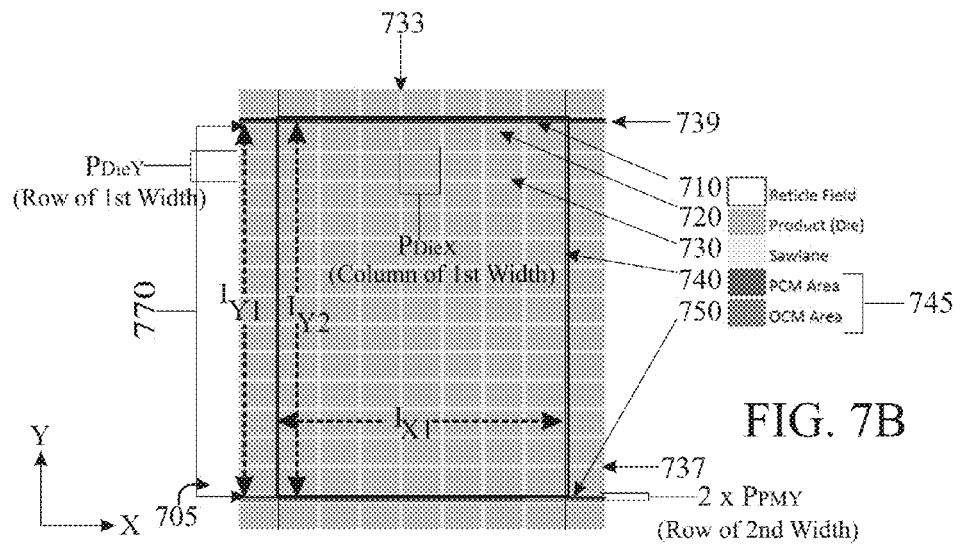
FIGS. 7A-7B is an arrangement of a reticle and its relationship to the defining of product devices and PM devices on a wafer substrate according to an embodiment of the present disclosure, the PM devices laid out in a row (X) direction.
Figure 7A:
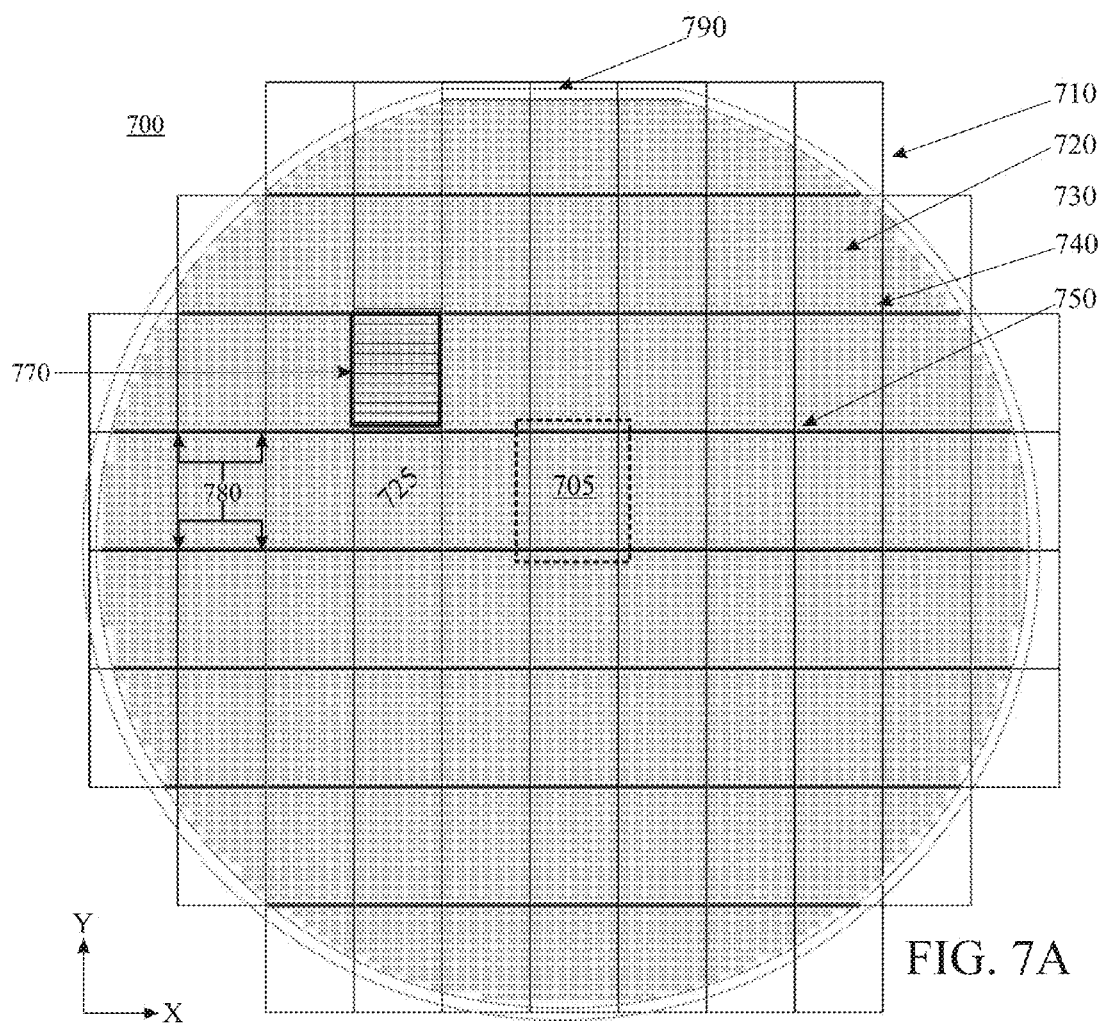

Refer to FIGS. 7A-7B. In an example embodiment, a reticle field 710 has a first exposure field 770 of device die 720 and a second exposure field 780 of PM devices 745. The PM devices 745 run parallel and horizontal with respect to the device die 720. As in the case of FIG. 6A, on a wafer substrate 700, the plurality 725 IC devices 720 and accompanying PM devices 745 have been printed on. With the reticle 710, the IC devices 720 and accompanying PM devices 745 are printed on. Saw lanes 730 separate the IC devices 720. The saw lanes 730 are of a minimum width to maximize the number of device die 720 to be printed.

For the example wafer substrate 700, the vertical columns perpendicular to the wafer flat 790 are of a first width. The horizontal rows 737 parallel to the wafer flat 790 have a first width for the device die and a second wider width 739 that accommodates the PM devices 745. The PM devices occupy an additional horizontal row of the second width. This horizontal row 739 of PM devices 745 forms a geometric chord on the circular wafer substrate; there will be one or more of these geometric chords of PM devices for a given wafer substrate. In addition, between intersecting saw lanes of the device die, the PM patterns would likely be modified to not have metallization at these intersections so as to facilitate sawing and die separation.

As with FIGS. 7A-7B, the probing apparatus can be configured to have multiple values of indexing for the example of FIGS. 8A-8B. For an example probing setup, pattern recognition may be programmed so that the wafer is indexed to the chosen device die under test. The indexing follows the relationships, $$\text{Index}_{Y1} = N \times \text{Pitch}_{DeviceDie} \quad (4)$$

$$\text{Index}_{Y2} = N \times \text{Pitch}_{DeviceDie} + 2 \times \text{Pitch}_{PM}(\text{Crossing over PM Patterns in } Y\text{-Direction}) \quad (5)$$

$$\text{Index}_{X1} = N \times \text{Pitch}_{DeviceDie}(\text{No crossing over PM Patterns in } X\text{-Direction}) \quad (6)$$

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

Numerous other embodiments of the invention will be apparent to persons skilled in the art without departing from the spirit and scope of the invention as defined in the appended claims.

The invention claimed is:

1. A semiconductor wafer substrate comprising:
   a first exposure field consisting of:
      a plurality of integrated circuits formed in an array of rows and columns within the first exposure field on the wafer substrate, and
      a set of first saw lanes and a set of second saw lanes separating the integrated circuits within the first exposure field, the set of first saw lanes being arranged parallel and equidistant with one another in a first direction defined by the rows, and the set of second saw lanes being arranged parallel and equidistant with one another in a second direction defined by the columns, wherein each of the set of first saw lanes and each of the set of second saw lanes has a first lane width; and
   a second exposure field adjacent to the first exposure field, the second exposure field comprising:
      a plurality of process modules (PM) formed in a first column within the second exposure field on the wafer substrate, the first column of process modules being arranged parallel and adjacent to a first column of integrated circuits of the first exposure field in the second direction, and
      a first individual saw lane being arranged in the second direction, the first individual saw lane separating the first column of process modules from the first column of integrated circuits, the first individual saw lane having the first lane width.

2. The semiconductor wafer substrate as recited in claim 1,
   wherein the first column of process modules is located on a first side of the first exposure field; and
   wherein
   the second exposure field further comprises:
      a second column of process modules being arranged parallel and adjacent to a second column of integrated circuits on a second side of the first exposure field in the second direction, the second side opposite the first side, and
      a second individual saw lane being arranged in the second direction, the second individual saw lane separating the second column of process modules from the second column of integrated circuits, the second individual saw lane having the first lane width.

3. The semiconductor wafer substrate as recited in claim 1 further comprising,
   a plurality of rectangular-shaped first exposure fields, each including rows and columns of integrated circuits separated by sets of first and the second saw lanes, and
   a plurality of rectangular-shaped second exposure fields, each including a separate column of process modules separated from an adjacent column of integrated circuits by an additional saw lane.

4. The semiconductor wafer substrate as recited in claim 3, wherein the plurality of rectangular-shaped second exposure fields are adjacent on one side of the plurality of rectangular-shaped first exposure fields.

5. The semiconductor wafer substrate as recited in claim 2, wherein the first and second exposure fields repeat across the wafer substrate in the first direction, and the first and second columns of process modules of adjacent second exposure fields form a single entity of process modules.

6. The semiconductor wafer substrate as recited in claim 5, wherein each of the integrated circuits in the first and second columns of integrated circuits has a first device width measured between adjacent second saw lanes, the single entity of process modules has a second device width measured between the first and second individual saw lanes, and the second device width is greater than the first device width.

7. The semiconductor wafer substrate as recited in claim 5, wherein each of the integrated circuits in the first and second columns of integrated circuits has a first device width measured between adjacent second saw lanes, the single entity of process modules has a second device width measured between the first and second individual saw lanes, and the second device width is less than the first device width.

8. The semiconductor wafer substrate as recited in claim 1, wherein the plurality of process modules includes at least one of the following: process control modules (PCM), optical control modules (OCM), alignment targets, T (thickness)-box lines.

9. The semiconductor wafer substrate as recited in claim 5, wherein the plurality of process modules are configured such that substantially no portion of a process module crosses a saw lane that runs perpendicular to the first column of process modules.

10. The semiconductor wafer substrate as recited in claim 5, wherein the single entity of process modules is bounded between the first and second individual saw lanes parallel to the first column of integrated circuits.

11. The semiconductor wafer substrate as recited in claim 8, including
a first PCM and a second PCM, the first PCM formed on a first portion of the wafer substrate and the second PCM formed on a second portion of the wafer substrate that is different than the first portion; and
a first OCM and a second OCM, the first OCM formed on a third portion of the wafer substrate and the second OCM formed on a fourth portion of the wafer substrate that is different than the third portion.

12. The semiconductor wafer substrate as recited in claim 11, wherein the first PCM is formed in a first additional column having a first device width and the second PCM is formed in a second additional column having a second device width.

13. The semiconductor wafer substrate as recited in claim 5, wherein the first column of process modules has a first device width, the second column of process modules has a second device width, and the single entity of process modules has a third device width that is a combination of the first device width and the second device width.

14. The semiconductor wafer substrate as recited in claim 13, wherein the first device width is not equal to the second device width.

* * * * *